US010495694B2

(12) United States Patent
Jung et al.

(10) Patent No.: US 10,495,694 B2
(45) Date of Patent: Dec. 3, 2019

(54) METHOD AND APPARATUS FOR DETECTING INTER-PHASE SHORT-CIRCUIT OF THREE-PHASE MOTOR AND AIR CONDITIONER INCLUDING THE SAME

(71) Applicant: LG ELECTRONICS INC., Seoul (KR)

(72) Inventors: Yongchan Jung, Seoul (KR); Wonwoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 24 days.

(21) Appl. No.: 15/868,133

(22) Filed: Jan. 11, 2018

(65) Prior Publication Data
US 2018/0259583 A1    Sep. 13, 2018

(30) Foreign Application Priority Data

Mar. 9, 2017   (KR) .................. 10-2017-0030140

(51) Int. Cl.
*G01R 31/34*    (2006.01)
*H02M 7/219*    (2006.01)
(Continued)

(52) U.S. Cl.
CPC ......... *G01R 31/343* (2013.01); *G01R 31/346* (2013.01); *H02H 7/0838* (2013.01);
(Continued)

(58) Field of Classification Search
CPC ...... H02P 3/22; H02P 29/0241; H02P 29/024; H02P 29/027; G01R 31/343;
(Continued)

(56) References Cited

U.S. PATENT DOCUMENTS 5,687,049 A * 11/1997 Mangtani ............. H02H 7/1227
                                                         361/18
6,469,461 B1 * 10/2002 Konda ................. H02H 7/0838
                                                         318/400.21
(Continued)

FOREIGN PATENT DOCUMENTS

JP            07274580 A  * 10/1995
JP          H 07-274580      10/1995
(Continued)

OTHER PUBLICATIONS

European Search Report dated Sep. 27, 2018 issued in Application No. 18150262.6.

*Primary Examiner* — Thai T Dinh
(74) *Attorney, Agent, or Firm* — Ked & Associates, LLP

(57) ABSTRACT

The present disclosure relates to inter-phase short-circuit detection, and particularly, to a method and apparatus for detecting inter-phase short-circuit of a three-phase motor, and an air conditioner including the same. The apparatus for detecting inter-phase short-circuit of a three-phase motor includes: a power supply for rectifying AC power to supply DC power; an inverter for generating three-phase current for driving the three-phase motor using the DC power, the inverter including a plurality of switching elements including high-side switching elements and low-side switching elements corresponding to three phases, and a current sensor commonly connected to the switching elements; a gate driver for driving the plurality of switching elements; and a controller for controlling the gate driver such that current flowing through the high-side switching elements and current flowing through the low-side switching elements partially short-circuit to sense a current flowing through the current sensor and determine inter-phase short-circuit.

17 Claims, 6 Drawing Sheets

(51) Int. Cl.
  *H02M 5/458*   (2006.01)
  *H02P 23/14*   (2006.01)
  *H02P 23/26*   (2016.01)
  *H02M 1/42*    (2007.01)
  *H02H 7/08*    (2006.01)
  *H02H 7/122*   (2006.01)

(52) U.S. Cl.
  CPC ....... *H02M 1/4233* (2013.01); *H02M 5/4585* (2013.01); *H02M 7/219* (2013.01); *H02P 23/14* (2013.01); *H02P 23/26* (2016.02); *H02H 7/1227* (2013.01)

(58) Field of Classification Search
  CPC ...... G01R 31/025; H02H 7/1225; H02H 3/08; H02H 3/083; H02H 7/1227; H02M 1/4233; H02M 5/4585
  See application file for complete search history.

(56) References Cited

U.S. PATENT DOCUMENTS

| | | | |
|---|---|---|---|
| 9,397,592 B2* | 7/2016 | Kezobo | B62D 5/0484 |
| 9,461,464 B2* | 10/2016 | Asako | H02H 9/02 |
| 2009/0009920 A1* | 1/2009 | Yamada | B60L 3/0023 |
| | | | 361/93.1 |
| 2009/0251831 A1* | 10/2009 | Shiba | B60L 3/003 |
| | | | 361/30 |
| 2010/0060222 A1* | 3/2010 | Kezobo | G01R 31/42 |
| | | | 318/490 |
| 2012/0050922 A1* | 3/2012 | Yamai | G01R 31/02 |
| | | | 361/31 |
| 2013/0200827 A1 | 8/2013 | Kezobo et al. | |
| 2014/0021893 A1* | 1/2014 | Komatsu | H02H 3/08 |
| | | | 318/400.22 |

FOREIGN PATENT DOCUMENTS

| | | |
|---|---|---|
| KR | 10-2003-0052847 | 6/2003 |
| KR | 10-1091636 | 12/2011 |
| KR | 10-2015-0019224 | 2/2015 |

* cited by examiner

METHOD AND APPARATUS FOR DETECTING INTER-PHASE SHORT-CIRCUIT OF THREE-PHASE MOTOR AND AIR CONDITIONER INCLUDING THE SAME

CROSS-REFERENCE TO RELATED APPLICATION

This application claims priority under 35 U.S.C. § 119 to Korean Application No. 10-2017-0030140, filed on Mar. 9, 2017, whose entire disclosure is hereby incorporated by reference.

BACKGROUND

1. Field

The present disclosure relates to inter-phase short-circuit detection, and more particularly, to a method and apparatus for detecting an inter-phase short-circuit, and an air conditioner including the same.

2. Background

A motor may drive a compressor of an air conditioner. Such a motor may be driven by alternating current (AC) power received from a power converter (or power converting circuit). The power converter may include, for instance, a rectifier, a power factor controller, and an inverter.

First, the rectifier may rectify a commercial AC voltage outputted from a commercial power supply to convert the commercial AC voltage to direct current (DC) voltage. The DC voltage rectified by the rectifier may be supplied to the inverter, and the inverter may convert the received DC voltage to drive the motor. For instance, the inverter may generate 3-phase AC voltage for driving the motor using the DC voltage outputted from the rectifier. Additionally, other components may be included in a power converter. For example, a DC-DC (or DC-to-DC) converter for changing, smoothing, or otherwise improving a power factor may be provided between the rectifier and the inverter, as necessary.

Meanwhile, a short-circuit may occur on a current path to the motor through the inverter for various reasons. Consequently, an overcurrent situation may be generated due to such inter-phase short-circuits. During an overcurrent, very high current may instantaneously flow through a current path, and one or more of the motor or devices in the inverter may be damaged within a relatively short time period. Accordingly, a method and device for rapidly and efficiently detecting such an inter-phase short-circuit may be desirable.

BRIEF DESCRIPTION OF THE DRAWINGS

The embodiments will be described in detail with reference to the following drawings in which like reference numerals refer to like elements, and wherein.

DETAILED DESCRIPTION

Figure 1:
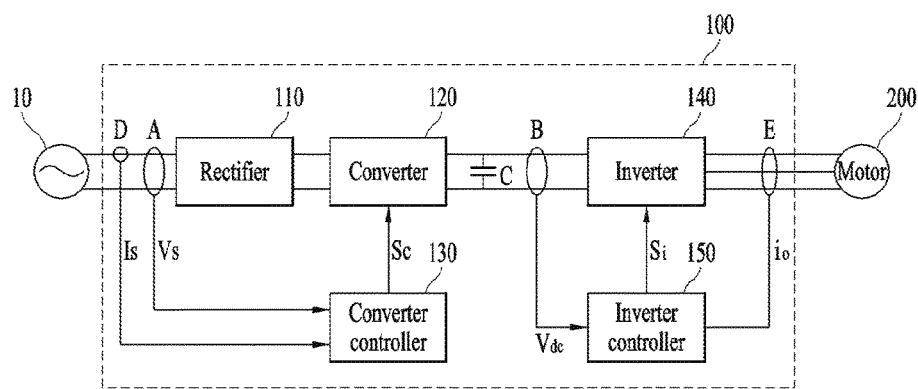
FIG. 1 is a block diagram of a power converter applicable to the present disclosure.
Figure 2:
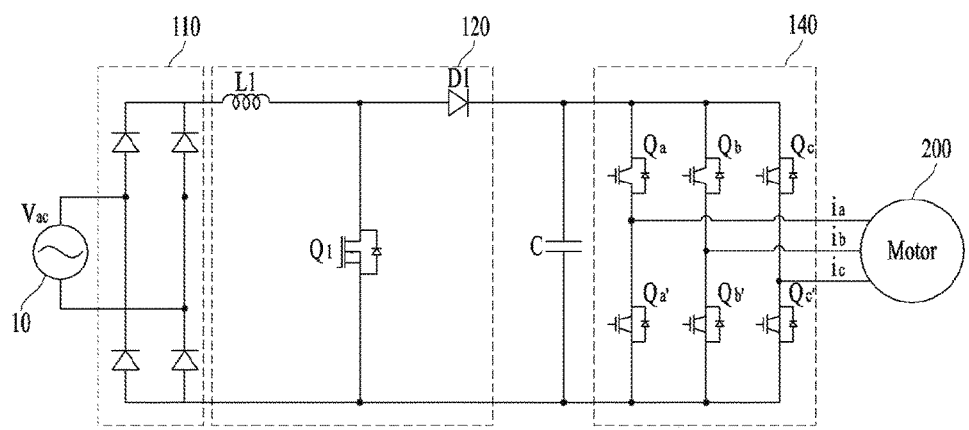
FIG. 2 is a circuit diagram of the power converter applicable to the present disclosure.

FIG. 1 is a block diagram of a power converter (or power converting circuit) 100, and FIG. 2 is a circuit diagram of the power converter applicable to the present disclosure. Referring to FIGS. 1 and 2, the power converter 100 may include a rectifier 110 for rectifying AC power 10, a converter 120 for boosting/dropping a DC voltage rectified by the rectifier 110 or controlling a power factor, a converter controller 130 for controlling the converter 120, an inverter 140 outputting a three-phase AC, an inverter controller 150 for controlling the inverter 140, and a DC-link capacitor C provided between the converter 120 and the inverter 140. The power converter 100 may further include a DC-link voltage detector B, an input voltage detector A, an input current detector D, and an output current detector E.

The inverter 140 may output a three-phase AC voltage to a motor 200. Hereinafter, the following discussion describes an example in which the motor 200 is a compressor motor that drives an air conditioner and the power converter 100 is a motor driver for driving the compressor motor 200. Accordingly, the motor driver and power converter may both be identified using reference numeral 100. However, the motor 200 is not limited solely to the compressor motor, and the short-circuit identification principles described herein may be used in various applications using a frequency-varied AC voltage, including, for example, AC motors of refrigerators, washing machines, electric vehicles, vehicles, cleaners, etc.

The motor driver 100 may receive AC power from a commercial power source or other system, may convert the AC power, and may supply the converter power to the motor 200. The converter 120 may convert the input AC power 10 into DC power. A DC-DC converter (also referred to as a DC-to-DC converter) operating as a power factor controller (PFC) may be used as the converter 120. In addition, such a DC-DC converter may include or use a boost converter. The converter 120 may include the rectifier 110 as necessary. Hereinafter, an example in which a boost converter is used as the converter 120 will be described.

The rectifier 110 may be provided with the single-phase AC power 10, may rectify the single-phase AC power 10, and may output the rectified power to the converter 120. To this end, the rectifier 110 may include or use a full-wave rectifier using a bridge diode.

The converter 120 may perform power factor improvement in a process of boosting and smoothing the voltage rectified by the rectifier 110. The converter 120 may include an inductor L1 connected to the rectifier 110, a switching element Q1 connected to the inductor L1 and connected in parallel with the capacitor C, and a diode D1 connected between the switching element Q1 and the DC-link capacitor C.

The boost converter 120 may be a converter capable of acquiring an output voltage higher than an input voltage. For example, when the diode D1 is cut off, energy stored in the inductor L1 and charges stored in the DC-link capacitor C may be discharged to generate an output voltage at an output port of the boost converter 120 when the switching element Q1 is turned on. In addition, when the switching element Q1 is cut off, energy stored in the inductor L1 while the switching element Q1 is turned on may be added and delivered to the output port.

In this configuration, the switching element Q1 can perform a switching operation according to a separate pulse width modulation (PWM) signal. That is, a PWM signal delivered from the converter controller 130 may be applied to the gate (or base) of the switching element Q1, and thus, the switching element Q1 may perform a switching operation according to the PWM signal. The converter controller 130 may include a gate driver which delivers a PWM signal to the gate of the switching element Q1 and a controller which delivers a driving signal to the gate driver.

The switching element Q1 may use a power transistor, for example, an insulated gate bipolar mode transistor (IGBT). An IGBT is a switching element having the structures of a metal oxide semi-conductor field effect transistor (MOSFET) and a bipolar transistor, and the IGBT may achieve low driving power, fast switching, high breakdown voltage and high current density.

In this manner, the converter controller 130 may control the timing of turning on the switching element Q1 included in the converter 120. For example, the converter controller 130 may output a converter control signal Sc for controlling the turn-on timing of the switching element Q1. To this end, the converter controller 130 may receive an input voltage Vs and an input current Is from the input voltage detector A and the input current detector D, respectively.

One or more of the converter 120 or the converter controller 130 may be omitted as necessary. For example, the output voltage, which has passed through the rectifier 110, may be stored in the DC-link capacitor C or this output voltage may drive the inverter 140 without passing through the converter 120 (e.g., when DC power is received from an external source).

The input voltage detector A can detect the input voltage Vs from the input AC power source 10. For example, the input voltage detector A may be located before the rectifier 110 (e.g., connected to a path between the AC power source 10 and the rectifier 110). The input voltage detector A may include a resistor, an operational amplifier, and the like for voltage detection. The detected input voltage Vs may be a discrete signal taking a pulse form and may be applied to the converter controller 130 in order to generate the converter control signal Sc.

The input current detector D can detect the input current Is from the input AC power 10. Specifically, the input current detector D can be located before the rectifier 110 (e.g., connected to a path between the AC power source 10 and the rectifier 110). The input current detector D may include a current sensor, a current transformer (CT), a shunt resistor, and the like for current detection. The detected input voltage Is may be a discrete signal taking a pulse form and may be applied, along with the detected input voltage Vs, to the converter controller 130 in order to generate the converter control signal Sc.

The DC voltage detector B may detect a pulsating voltage Vdc of the DC-link capacitor C. For such voltage detection, a resistor, an operational amplifier and the like may be used. The detected voltage Vdc of the DC-link capacitor C may be a discrete signal taking a pulse form and may be applied to the inverter controller 150. An inverter control signal Si can be generated by the inverter controller 150 on the basis of the DC voltage Vdc of the DC-link capacitor C. In another example (not shown in the figures), the detected DC voltage from DC voltage detector B may be applied to the converter controller 130, and the converter controller 130 may use the detected DC voltage, for example, when generating the converter control signal Sc.

As shown in FIG. 2, the inverter 140 may include a plurality of inverter switching elements Qa, Qb, Qc, Qa', Qb' and Qc', and may convert the DC voltage Vdc that is smoothed according to on/off operations of the switching elements Qa, Qb, Qc, Qa', Qb' and Qc' into a three-phase AC voltage having a predetermined frequency. The inverter 140 may output the three-phase AC power to the three-phase motor 200. Specifically, in the inverter 140, high-side switching elements Qa, Qb and Qc and low-side switching elements Qa', Qb' and Qc' may be respectively connected and paired, and the three pairs of high-side switching elements Qa, Qb and Qc and the low-side switching elements Qa', Qb' and Qc' may be connected in parallel. Similar to the converter 120, a power transistor, such as an IGBT, may be used as or included in each of the switching elements Qa, Qb, Qc, Qa', Qb' and Qc' of the inverter 140.

The inverter controller 150 may output the inverter control signal Si to the inverter 140 in order to control the switching operation of the inverter 140. The inverter control signal Si may be a PWM switching control signal, and the inverter control signal Si may be generated on the basis of an output current io flowing from the inverter 140 to the motor 200. The inverter control signal Si may be generated further on the basis of the DC-link voltage Vdc across the DC-link capacitor C. Here, the output current io may be detected from the output current detector E, and the DC-link voltage Vdc may be detected from the DC-link voltage detector B.

The inverter controller 150 may include a gate driver 151 (refer to FIG. 3) which delivers a PWM signal (e.g., the inverter control signal Si) to the gates of the switching elements Qa, Qb, Qc, Qa', Qb' and Qc' included in the inverter 140. The inverter controller 150 may further include a controller 152 which may deliver a driving signal to the gate driver 151.

The output current detector E may detect the output current io flowing between the inverter 140 and the motor 200. That is, the output current detector E may detects a current flowing through the motor 200. The output current detector E may separately detect respective output currents ia, ib and ic of the respective three phases AC voltage applied to the motor 200 or may detect output currents of two of these phases using three-phase balancing. The output current detector E may be located between the inverter 140 and the motor 200 and may include a current transformer (CT), a shunt resistor or the like for current detection.

Figure 3:
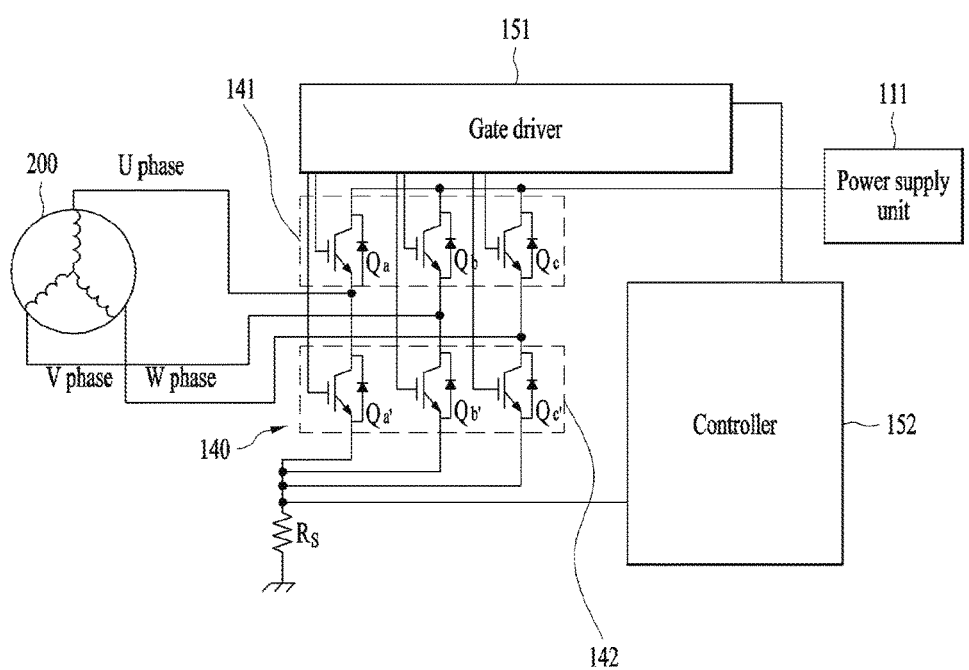
FIG. 3 is a circuit diagram illustrating a power converter according to an embodiment of the present disclosure in detail.

FIG. 3 is a circuit diagram illustrating a power converter according to an embodiment of the present disclosure in detail. The power converter 100 that may be used for driving the motor 200, as described above with reference to FIGS. 1 and 2, is briefly illustrated in FIG. 3. The details of common components described with reference to FIGS. 1 and 2 can be applied to circuit configuration shown in FIG. 3, and redundant descriptions will be omitted in the following description of FIG. 3.

Circuitry that may collectively include the rectifier 110 connected to the AC power supply 10, the DC-link capacitor C and the converter 120, shown in FIGS. 1 and 2, may be represented as a power supply unit (or power supply) 111 in FIG. 3. In another example, the power supply unit 111 may include only the rectifier 110 and the DC-link capacitor C and, thus, may omit the AC power supply 10 and/or the converter 120.

The switching elements of the inverter 140 are illustrated as being divided into a high-side switching element group 141 that includes switching elements Qa, Qb, and Qc, and a low-side switching element group 142 that includes switching elements Qa', Qb', and Qc'. Here, pairs of the switching element associated with respective phases (e.g., high-side switching elements Qa and low-side-switching elements Qa' for U phase) may be connected to a current sensor Rs. The current sensor Rs may be implemented, for example, as a shunt resistor. The current received at the shunt resistor Rs may be evaluated as a product of current and resistance according to Ohm's law, and may be converted into a voltage signal that is provided to the controller 152.

As described above, the inverter controller 150 may include the gate driver 151 which may transfer a PWM signal or other driving signal to the gates of the switching elements Qa, Qb, Qc, Qa', Qb' and Qc' included in the inverter 140 and the controller 152 which transfers a driving signal to the gate driver 151. That is, the gate driver 151 may supply an on/off (or high/low) signal to the gates of the switching elements included in the high-side switching element group 141 and the low-side switching element group 142 to control on/off of the switching elements. Here, the controller 152 can control the gate driver 151 by transferring a driving signal such as a PWM signal to the gate driver 151.

The inverter 140 may generate three-phase AC power and may provide the generated three-phase AC power to the motor 200. The three-phase AC power may be represented as a U phase, a V phase and a W phase, as illustrated in FIG. 3. The three phases may also be referred to as first phase, a second phase and a third phase, as appropriate. For example, the first phase, the second phase and the third phase may refer to the U phase, the V phase and the W phase, respectively, but the first, second, and third phases may have other meanings and may refer to different ones of the U, V, and W phases. For example, the first phase, the second phase and the third phase may respectively correspond to the W phase, the U phase and the V phase, as appropriate.

Figure 4:
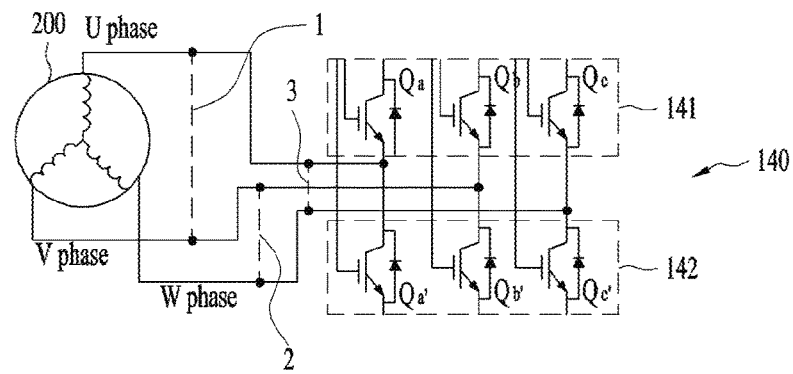
FIG. 4 illustrates paths on which a short-circuit may occur in a configuration of connection between the motor and the inverter.

FIG. 4 illustrates potential paths on which a short-circuit may occur in connections between the motor 200 and the inverter 140. Referring to FIG. 4, a short-circuit may occur on a path 1 between the U phase and the V phase connections, on a path 2 between the V phase and the W phase connections, and/or on a path 3 between the W phase and the U phase connections among the paths between the motor 200 and the inverter 140.

For example, current flowing from the first switching element Qa of the high-side switching element group 141, which corresponds to the U phase, may pass through the short-circuit path 1 between the U phase and the V phase connections when flowing to the V phase through the motor 200 and may pass through the short-circuit path 3 between the U phase and the W phase connections when flowing to the W phase through the motor 200. Similarly, when current flows from the second switching element Qb or the third switching element Qc of the high-side switching element group 141, which corresponds to the V phase or the W phase, the current can pass through the remaining short-circuit path 2 between the V phase and the W phase connections.

Consequently, to check for a short-circuit on one or more of the three paths between the U, V, and W phases, signals may be applied to selectively activate/deactivate two different sets of switching elements associated with the U, V, and W phases. In this manner, the gate driver 151 may be controlled such that when current flowing through the high-side switching elements and current flowing through the low-side switching elements partially short-circuits, the current sensor Rs senses the quantity of flowing current at that moment, and the controller 152 identifies the inter-phase short-circuit. For example, the current may be controlled to selectively pass through the pairs of the potential short-circuit paths 1, 2 and 3, as described above, and the quantity of current through pairs of the short-circuit paths 1, 2, and/or 3 may be sensed to identify a particular one of inter-phase short-circuit.

Figure 5:
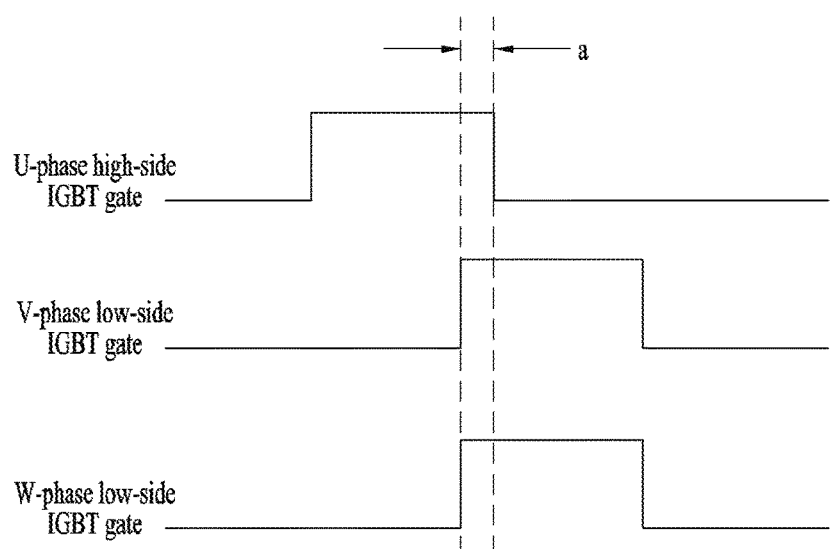
FIG. 5 is a signal diagram illustrating inverter driving signals for determining an inter-phase short-circuit according to a first embodiment of the present disclosure.

Hereinafter, the method and configuration for determining an inter-phase short-circuit will be described in detail with reference to the drawings. FIG. 5 is a signal diagram illustrating inverter driving signals for determining an inter-phase short-circuit according to a first embodiment of the present disclosure, and FIG. 6 is a signal flow diagram illustrating an inverter driving signal for determining an inter-phase short-circuit according to the first embodiment of the present disclosure.

Figure 6:
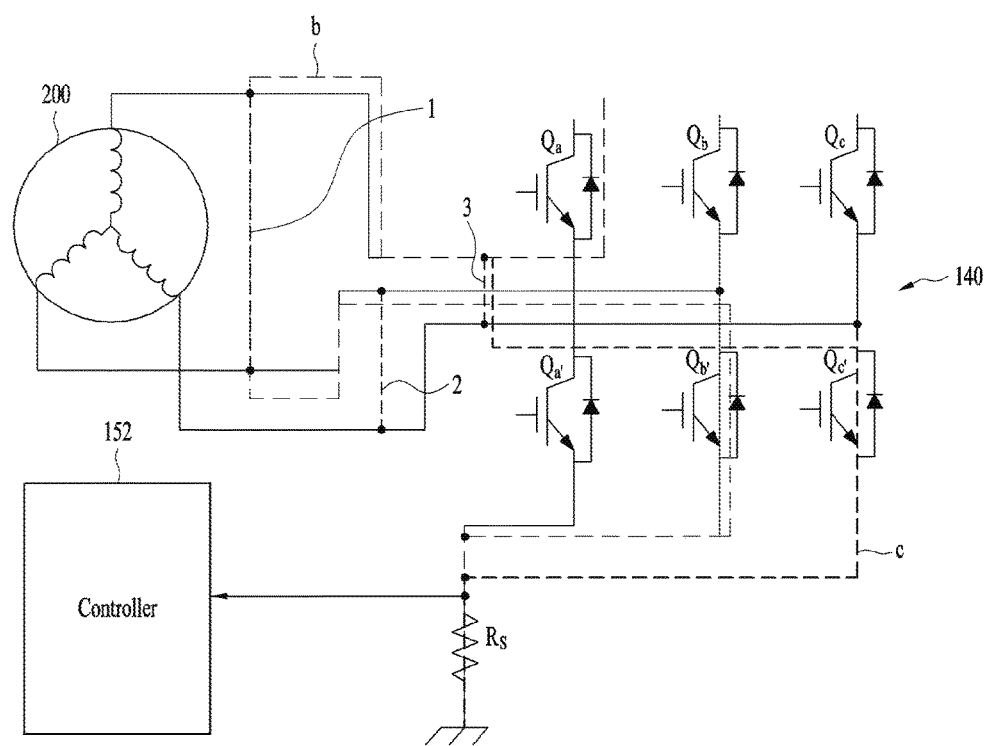
FIG. 6 is a signal flow diagram illustrating an inverter driving signal for determining an inter-phase short-circuit according to the first embodiment of the present disclosure.

Referring to FIGS. 5 and 6, the controller 152 may turn on the high-side switching element (IGBT) Qa corresponding to the U phase among the three phases and control the gate driver 151 such that ON time of the low-side switching elements (IGBT) Qb' and Qc' corresponding to the V phase and the W phase overlaps with ON time of the high-side switching element Qa for a first time a to determine whether a short-circuit occurs on one of the short-circuit path 1 between the U phase and the V phase or on the short-circuit path 3 between the U phase and the W phase.

Referring to FIG. 6, the inverter may be driven such that switching elements Qa, Qb', and Qc' are activate while switching elements Qa', Qb, and Qc are inactive. In this state, a current should not be detected at the shunt resistor Rs unless a short circuit is present on paths 1 or 3 since the U phase path is closed by inactive switching element Qa', and no current is provided on V phase or the W phase through inactive switching elements Qb and Qc. A current flowing from the high-side switching element Qa corresponding to the U phase can potentially pass through the short-circuit path 1 between the U phase and the V phase and the low-side switching element Qb' corresponding to the V phase and reach the shunt resistor Rs. The current flowing from the high-side switching element Qa corresponding to the U phase among the three phases can also potentially pass through the short-circuit path 3 between the U phase and the W phase and the low-side switching element Qc' corresponding to the W phase and reach the shunt resistor Rs. As described below, the inverter 140 may be driven in this manner such that gates on signals of the high side switching elements 141 and the low side switching element overlap during a relatively short time period to allow current to flow only for a minimum time for detecting the short-circuit.

Here, all currents pass through the shunt resistor Rs. A voltage value applied to the shunt resistor Rs may be transferred through an input port pin of the controller 152 implemented as a semiconductor integrated circuit (IC), such as a microcomputer. Then, the controller 152 can detect a short-circuit by comparing the voltage value applied to the shunt resistor Rs to a predetermined threshold voltage value and may determine that a short circuit is present when, for example, the voltage value applied to the shunt resistor Rs exceeds the predetermined threshold voltage value or differs from the threshold voltage value by at least particular amount.

In the configuration associated with the first implementation, a first time during which one of the high-side switching elements 141 and other low-side switching elements are activated (shown as time period a in FIG. 5) may be a minimum duration of a pulse signal that can be generated by the controller 52. That is, the first time may be a duration of a shortest pulse signal which can be generated by a microcomputer, such as a semiconductor IC. For example, the duration of such a pulse signal may be 10 to 20 µs. However, a minimum duration of such a pulse signal may vary according to the performance of the IC (microcomputer) which implements the controller 152.

It is possible to determine whether a short-circuit is present between two of the three phases occurs by driving the inverter 140 as described above. For example, the inverter 140 may be driven such that switching elements Qa, Qb', and Qc' are activate while switching elements Qa', Qb, and Qc are inactive to determine whether a short circuit is present between the U phase and one of the V or W phases along short-circuit paths 1 and 3 in FIGS. 4 and 6.

In other embodiments, the inverter 140 may be driven such that different combinations of switching elements are activate or inactive to determine whether a short circuit is present along different ones of short-circuit paths 1, 2, or 3. For example, FIG. 7 is a signal diagram illustrating inverter driving signals for determining an inter-phase short-circuit according to a second embodiment of the present disclosure, and FIG. 8 is a signal flow diagram illustrating an inverter driving signal for determining an inter-phase short-circuit according to the second embodiment of the present disclosure.

Figure 7:
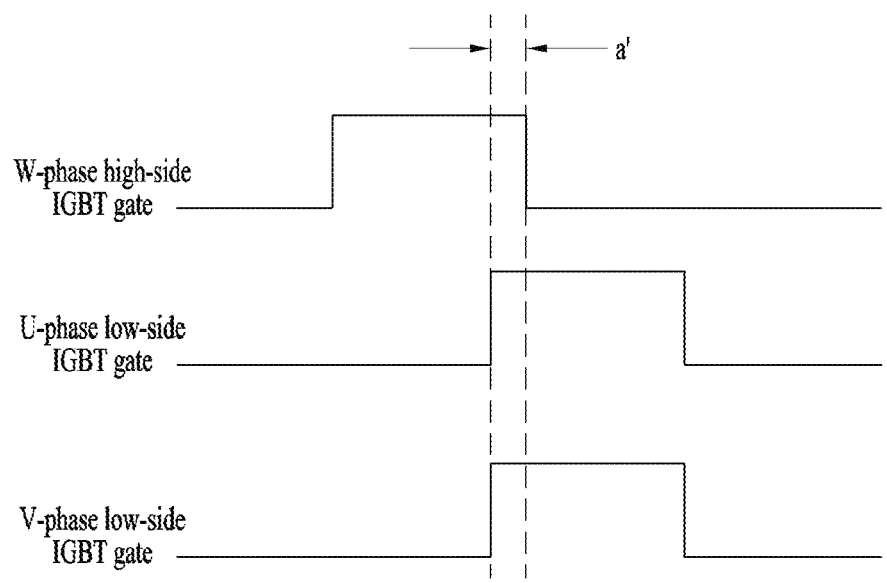
FIG. 7 is a signal diagram illustrating inverter driving signals for determining an inter-phase short-circuit according to a second embodiment of the present disclosure.
Figure 8:
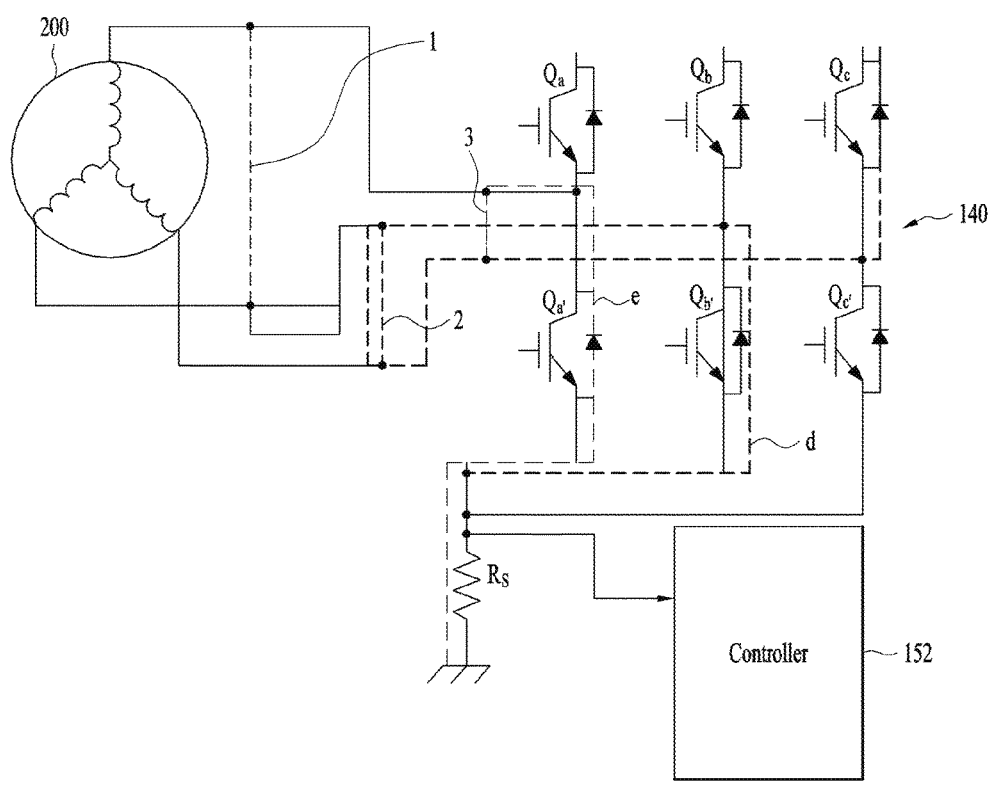
FIG. 8 is a signal flow diagram illustrating an inverter driving signal for determining an inter-phase short-circuit according to the second embodiment of the present disclosure.

Referring to FIGS. 7 and 8, the controller 152 may control the gate driver 151 such that ON time of the high-side switching element Qc corresponding to the W phase overlaps with ON time of the low-side switching elements Qa' and Qb' corresponding to the U phase and the V phase during a second time period a'. During the second time a', the low-side switching element Qc' is inactive such that no W phase current should be present, and high-side switching element Qa and Qb are inactive such that no currents for the U and V phases should be present when no short-circuit is present on the short-circuit paths 2 or 3.

Referring to FIG. 8, current flowing from the high-side switching element Qc corresponding to the W phase may potentially pass through the short-circuit path 3 between the U phase and the W phase and the low-side switching element Qa' corresponding to the U phase and reach the shunt resistor Rs. In addition or in the alternative, current flowing from the high-side switching element Qc corresponding to the W phase among the three phases may potentially pass through the short-circuit path 2 between the V phase and the W phase and the low-side switching element Qb' corresponding to the V phase and reach the shunt resistor Rs. Thus, a short circuit along one of short-circuit paths 2 or 3 may be detected if a current is measured at the shunt resistor Rs during the second time period a'. In this manner, the inverter 140 may be driven such that gate on signals are applied to selectively active and overlap certain ones of the high side and the low side switching elements during the relatively short second time period a' to allow current to potentially flow only for a minimum time to detect a short-circuit.

Here, all currents pass through the shunt resistor Rs, and these currents can be evaluated to identify a short circuit through the motor 200 or the power converter 100, similar to the manner previously described with respect to FIGS. 4-6. For example, a voltage value applied to the shunt resistor Rs may be transferred through an input port pin of the controller 152 implemented as a semiconductor integrated circuit (IC), such as a microcomputer. Then, the controller 152 can determine when a short-circuit is present by comparing the voltage value applied to the shunt resistor Rs with a predetermined threshold voltage value. Here, the second time a' may be a minimum duration of a pulse signal which can be generated by the controller. Furthermore, the second time a' may be the same as or substantially correspond to the aforementioned first time a described with respect to FIGS. 4-6. The description of the first time a in the aforementioned first embodiment can be equally applied to the second time a'.

As described above, it is possible to determine whether short-circuit occurs on one or more of the short-circuit path 1 between the U phase and the V phase and the short-circuit path 3 between the U phase and the W phase according to circuit operation of the first embodiment. Furthermore, it is possible to determine whether short-circuit occurs on one or more of the short-circuit path 3 between the U phase and the W phase and the short-circuit path 2 between the V phase and the W phase according to circuit operation of the second embodiment. Therefore, it is available to determine whether short-circuit occurs on any of the short-circuit paths 1, 2 and 3 according to a combinations of the two operations.

For example, it may be determined that no short circuit is present on any of the short circuit paths 1, 2, and 3 when no unexpected voltage is detected either of time periods a and a'. Alternatively, it may be determined that a short circuit is present on short circuit path 2 when unexpected voltage is detected during the second time period a' and not during the first time period a, or is present on short circuit path 3 when an unexpected voltage is detected during the first time period a and not during the second time period a'. Finally, it may be determined that a short-circuit is present on at least short circuit path 1 (and possibly on all three short circuit paths 1, 2, and 3) when an unexpected voltage is detected during both the first periods a and a'.

As necessary, the gate driver 151 may be controlled such that the ON time of the high-side switching element Qb corresponding to the V phase, among the three phases, overlaps with the ON time of the low-side switching elements Qa' and Qc' corresponding to the U phase and the W phase for the second time a' in the second embodiment. Additionally, the gate driver 151 may be controlled to place the switching elements in this state during a third time period a".

Inter-phase short-circuit determination as described above may be performed according to control of the controller 152 before the motor 200 is started. That is, the inter-phase short-circuit determination can be performed prior to normal operation of an air conditioner equipped with the motor 200 and the power converter 100. Accordingly, protection operation can be performed depending on whether an inter-phase short-circuit occurs. For example, an indication of whether short-circuit has occurred may be displayed to user such that normal operation of the air conditioner is not performed, or a path on which short-circuit has occurred may be displayed as necessary.

As described above, an occurrence of short-circuit may detected by enabling a short-circuiting of part of inverter circuit paths for a very short time to prevent device damage due to instantaneous overcurrent. That is, according to the present disclosure, it is available to detect an inter-phase short-circuit state prior to operation using only a gate driving signal of switching elements which form the inverter. Accordingly, because an inter-phase short-circuit can be detected relatively quickly in the power converter 100 and the shorted power converter 100 can be deactivated or otherwise controlled, a possibility of device damage due to the inter-phase short-circuit can be minimized. Such an inter-phase short-circuit determination can be performed only by controlling operation of the gate driver by the controller without an additional circuit configuration.

Aspects of the present disclosure provide a method and apparatus for rapidly and efficiently detecting an inter-phase short-circuit in an air conditioner and an air conditioner including the same. In a first aspect of the present disclosure, an apparatus for detecting an inter-phase short-circuit of a three-phase motor includes: a power supply unit for rectifying AC power to supply DC power; an inverter for generating three-phase current for driving the three-phase motor using the DC power, the inverter including a plurality of switching elements including high-side switching elements and low-side switching elements corresponding to three phases, and a current sensor commonly connected to the switching elements; a gate driver for driving the plurality of switching elements; and a controller for controlling the gate driver such that current flowing through the high-side switching elements and current flowing through the low-side switching elements partially short-circuit to sense the quantity of current flowing through the current sensor and determine inter-phase short-circuit.

In a second aspect of the present disclosure, an air conditioner equipped with an inter-phase short-circuit detection apparatus includes: a three-phase motor; a power supply unit for rectifying AC power to supply DC power; an inverter for generating three-phase current for driving the three-phase motor using the DC power, the inverter including a plurality of switching elements including high-side switching elements and low-side switching elements corresponding to three phases, and a current sensor commonly connected to the switching elements; a gate driver for driving the plurality of switching elements; and controller for controlling the gate driver such that current flowing through a high-side switching element corresponding to a first phase of the three phases simultaneously flows through low-side switching elements corresponding to second and third phases for a first time, and sensing the quantity of current flowing through the current sensor to determine inter-phase short-circuit.

In a third aspect of the present disclosure, a method for detecting an inter-phase short-circuit of an inverter including a plurality of switching elements including high-side switching elements and low-side switching elements corresponding to three phases of a motor driven by three-phase current generated by the inverter includes: flowing inverter current such that current flowing through the high-side switching elements and current flowing through the low-side switching elements partially short-circuit; sensing the quantity of the inverter current; and comparing the quantity of the inverter current with a predetermined threshold value to determine inter-phase short-circuit.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus to detect an inter-phase short-circuit of a three-phase motor, the apparatus comprising:
   a power supply that rectifies alternating current (AC) power to generate direct current (DC) power;
   an inverter that generates three-phase current to drive the three-phase motor using the DC power, the inverter including:
      a plurality of switching elements including high-side switching elements and low-side switching elements corresponding to three phases of the three-phase motor, and
      a current sensor commonly connected to the switching elements;
   a gate driver that drives the plurality of switching elements; and
   a controller that controls the gate driver such that the high-side switching elements and the low-side switching elements are selectively activated or deactivated to provide one or more inter-phase partial short-circuit paths and that detects the inter-phase short-circuit based on current flowing to the current sensor through the one or more inter-phase partial short-circuit paths,
   wherein the controller controls the gate driver such that an ON time of one of the high-side switching elements corresponding to a first phase of the three phases overlaps with an ON time of ones of the low-side switching elements corresponding to remaining second and third phases of the three phases for a first time period.

2. The apparatus according to claim 1, wherein the controller additionally controls the gate driver such that an ON time of one of the high-side switching elements corresponding to the third phase of the three phases overlaps with an ON time of two of the low-side switching elements corresponding to the first and second phases during a second time period.

3. The apparatus according to claim 2, wherein a duration of the first time period corresponds to a duration of the second time period.

4. The apparatus according to claim 3, wherein the controller is implemented as a semiconductor integrated circuit (IC), and the durations of the first time period and the second time period correspond to a minimum duration of a pulse signal generated by the semiconductor IC.

5. The apparatus according to claim 4, wherein the minimum duration of the pulse signal generated by the semiconductor IC is 10 to 20 μs.

6. The apparatus according to claim 1, wherein the controller detects the inter-phase short-circuit based on comparing the current flowing via the one or more inter-phase partial short-circuit paths and through the current sensor with a prescribed threshold value.

7. An air conditioner comprising:
a three-phase motor;
a power supply that rectifies received alternating current (AC) power to generate direct current (DC) power;
an inverter that generates a three-phase current to drive the three-phase motor using the DC power, the inverter including:
a plurality of switching elements including high-side switching elements and low-side switching elements corresponding to the three phases of the three-phase motor, and
a current sensor commonly connected to the switching elements;
a gate driver that drives the plurality of switching elements; and
a controller that controls the gate driver such that when an inter-phase short-circuit is present, a current flowing through one of the high-side switching elements corresponding to a first phase of the three phases simultaneously flows through one or more of two of the low-side switching elements corresponding to second and third phases during a first time period, and that detects the inter-phase short-circuit based on a current flowing through the current sensor,
wherein the controller controls the gate driver such that an ON time of one of the high-side switching elements corresponding to the first phase of the three phases overlaps with an ON time of ones of the low-side switching elements corresponding to the remaining second and third phases of the three phases for a first time period.

8. The air conditioner according to claim 7, wherein the controller additionally controls the gate driver such that an ON time of one of the high-side switching elements corresponding to the third phase overlaps with an ON time of two of the low-side switching elements corresponding to the first and second phases during a second time period.

9. The air conditioner according to claim 8, wherein a duration of the first time corresponds to a duration of the second time.

10. The air conditioner according to claim 9, wherein the controller is implemented as a semiconductor integrated circuit (IC), and the durations of the first time period and the second time period correspond to a minimum duration of a pulse signal generated by the semiconductor IC.

11. The air conditioner according to claim 10, wherein the minimum duration of the pulse signal generated by the semiconductor IC is 10 to 20 µs.

12. The air conditioner according to claim 7, wherein the controller detects the inter-phase short-circuit based on comparing the current flowing through the current sensor with a prescribed threshold value.

13. A method to detect an inter-phase short-circuit of an inverter having a plurality of switching elements including high-side switching elements and low-side switching elements corresponding to three phases of a motor driven by three-phase current generated by the inverter, the method comprising:
selectively activating and deactivating the high-side switching elements and the low-side switching elements to provide one or more inter-phase partial short-circuit paths;
sensing an inverter current through the one or more inter-phase partial short-circuit paths; and
comparing the inverter current with a prescribed threshold value to detect the inter-phase short-circuit,
wherein selectively activating and deactivating the high-side switching elements and the low-side switching elements includes controlling the high-side switching elements and the low-side switching elements such that an ON time of one of the high-side switching elements corresponding to a first phase of the three phases overlaps with an ON time of two of the low-side switching elements corresponding to second and third phases during a first time period.

14. The method according to claim 13, wherein an ON time of one of the high-side switching elements corresponding to the third phase overlaps with an ON time of two of the low-side switching element corresponding to the first and second phases during a second time period.

15. The method according to claim 14, wherein a duration of the first time period corresponds to a duration of the second time period.

16. The method according to claim 15, wherein the durations of the first time period and the second time period correspond to a minimum duration of a pulse signal generated by a semiconductor integrated circuit (IC) controlling the plurality of switching elements.

17. The method according to claim 16, wherein the minimum duration of the pulse signal generated by the semiconductor IC is 10 to 20 µs.

* * * * *